United States Patent
Yang

[11] Patent Number: 5,956,571
[45] Date of Patent: Sep. 21, 1999

[54] SOLAR BATTERY WITH THIN FILM TYPE OF SINGLE CRYSTAL SILICON

[76] Inventor: Mei-Hua Yang, No. 50-2, Fu-Hsing Rd. Pei-Tou, Taipei, Taiwan

[21] Appl. No.: 08/850,859
[22] Filed: May 2, 1997
[51] Int. Cl.⁶ .................................................. H01L 31/18
[52] U.S. Cl. .............................. 438/69; 438/57; 257/436; 136/255; 136/261
[58] Field of Search ................................... 438/57, 69, 71, 438/72; 136/252, 255, 256, 261; 257/431, 432, 436, 437

[56] References Cited

U.S. PATENT DOCUMENTS 5,472,885  12/1995  Matsuno et al. .
5,508,206   4/1996  Glenn et al. .
5,665,607   9/1997  Kawama et al. .

OTHER PUBLICATIONS

G.F. Zheng et al., "Thin film silicon solar cells on glass by substrate thinning", Solar Energy Materials and Solar Cells, vol. 32, pp. 129–135 (no month given), 1994.

Primary Examiner—Chandra Chaudhari
Assistant Examiner—Keith Christianson

[57] ABSTRACT

A solar battery which has thin film type of single crystal silicon, and a method for manufacturing such a solar battery is disclosed. A transparent glass plate is adhered to an upper surface of a silicon substrate, having active regions to transform solar energy into electric energy. The bottom surface of the substrate is ground from hundreds of micrometers to several tens of micrometers, or even to several micrometers in thickness such that the substrate is semi-transparent or transparent. An anti-reflective layer is coated over the bottom surface of the substrate so as to increase the possibility for the incident light onto the solar battery to convert into electric energy and further improve the efficiency of energy transformation.

4 Claims, 14 Drawing Sheets

(N)

SOLAR BATTERY WITH THIN FILM TYPE OF SINGLE CRYSTAL SILICON

FIELD OF THE INVENTION

The present invention relates to a solar battery, and more particularly, to a solar battery with a thin layer of single crystal silicon to increase the efficiency of transformation from solar to electrical energy by reducing the thickness of silicon substrate and further decreasing the amount of energy absorbed by the silicon substrate.

BACKGROUND OF THE INVENTION

A solar battery is one of the most important energy sources available for scientists to save energy consumption, and serves as a spare source while normal power supply shuts down. There are well-known methods for manufacturing several types of solar battery to improve efficiency of energy transformation and save cost. The solar battery in the prior arts has low efficiency of energy transformation because most power of incident light is absorbed by the silicon substrate, which is thick, about hundreds of micrometers, and only little portion of light can be converted into electric energy by active regions in the substrate.

SUMMARY OF THE INVENTION

The object of the present invention is to provide a solar battery with a single crystal silicon substrate, which is ground to reduce thickness.

Another object of the present invention is to provide a thin film type of solar battery having an anti-reflective layer on the bottom of the substrate.

Further object of the present invention is to provide a solar battery having a glass plate to reflect incident light back to active regions so as to increase efficiency of energy transformation.

Other features and advantages of the present invention will become apparent from the following description which refers to the accompanying drawings.

DETAILED DESCRIPTION OF THE PREFERRED EMBODIMENTS

Figure 1:
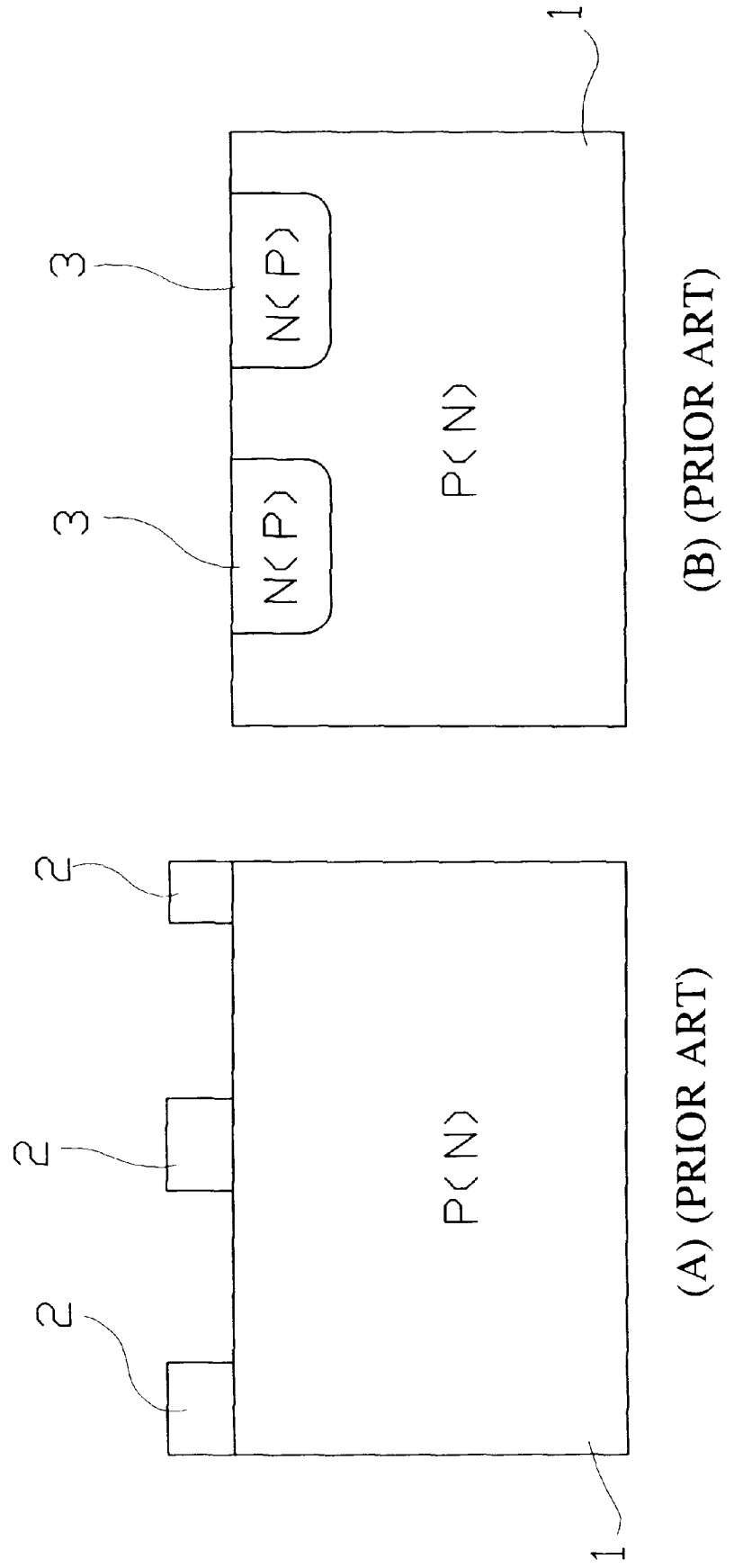
FIGS. 1A to 1N shows schematic diagrams of a solar battery in the present invention.
Figure 1:
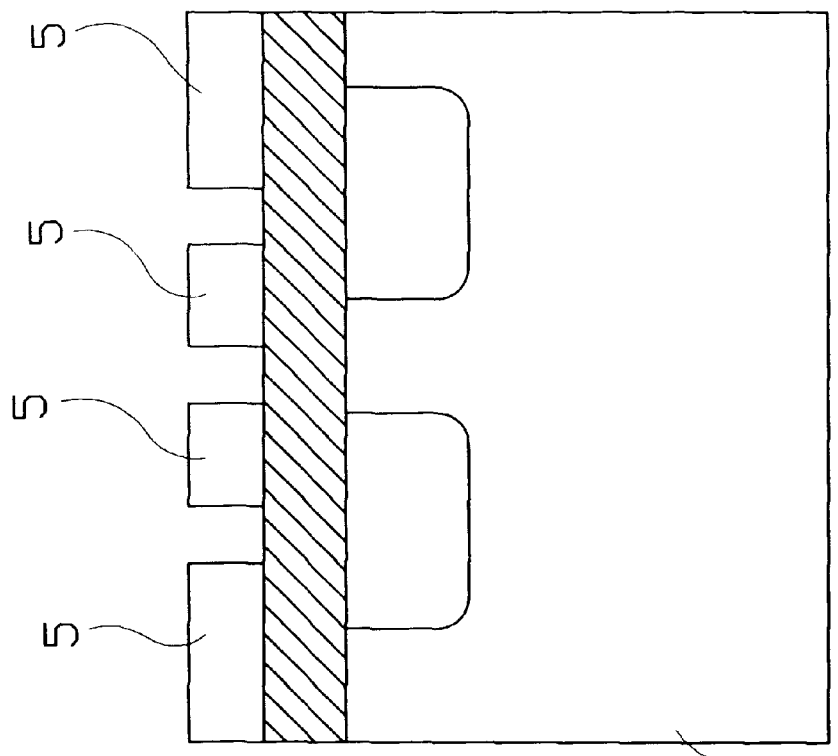
Figure 1:
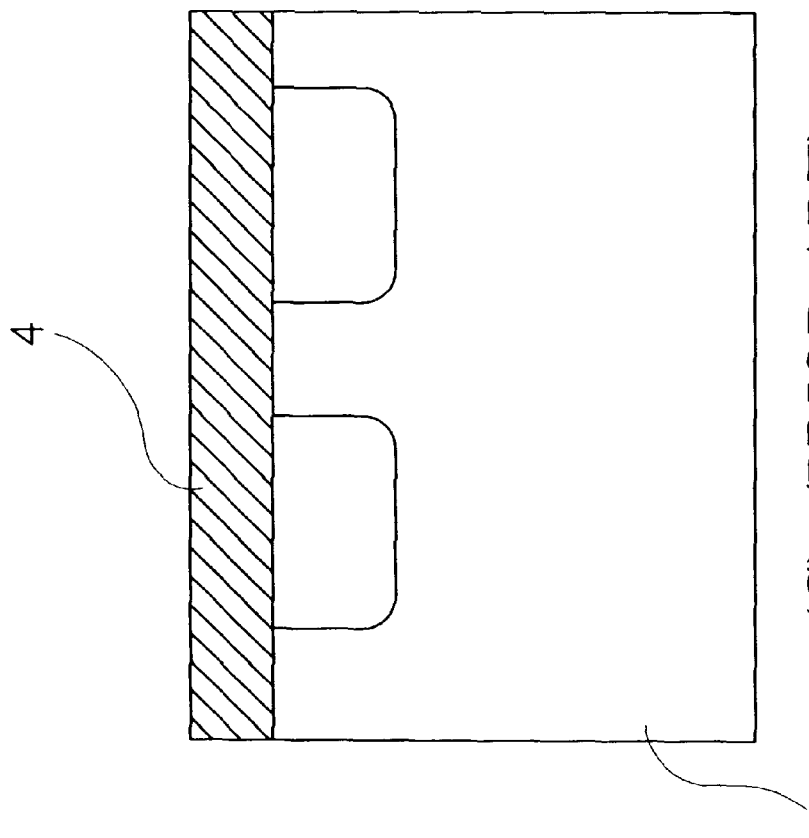
Figure 1:
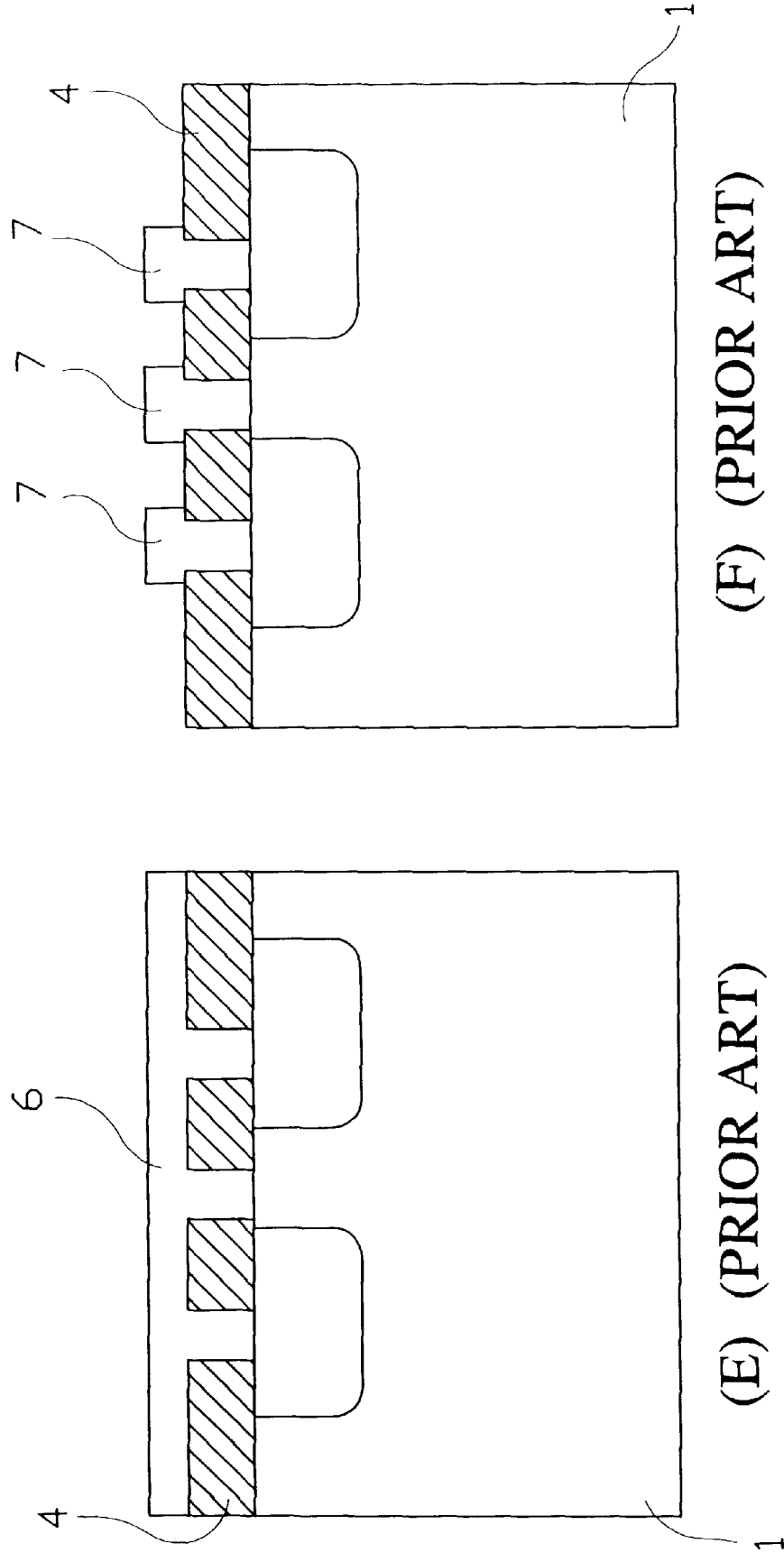
Figure 1:
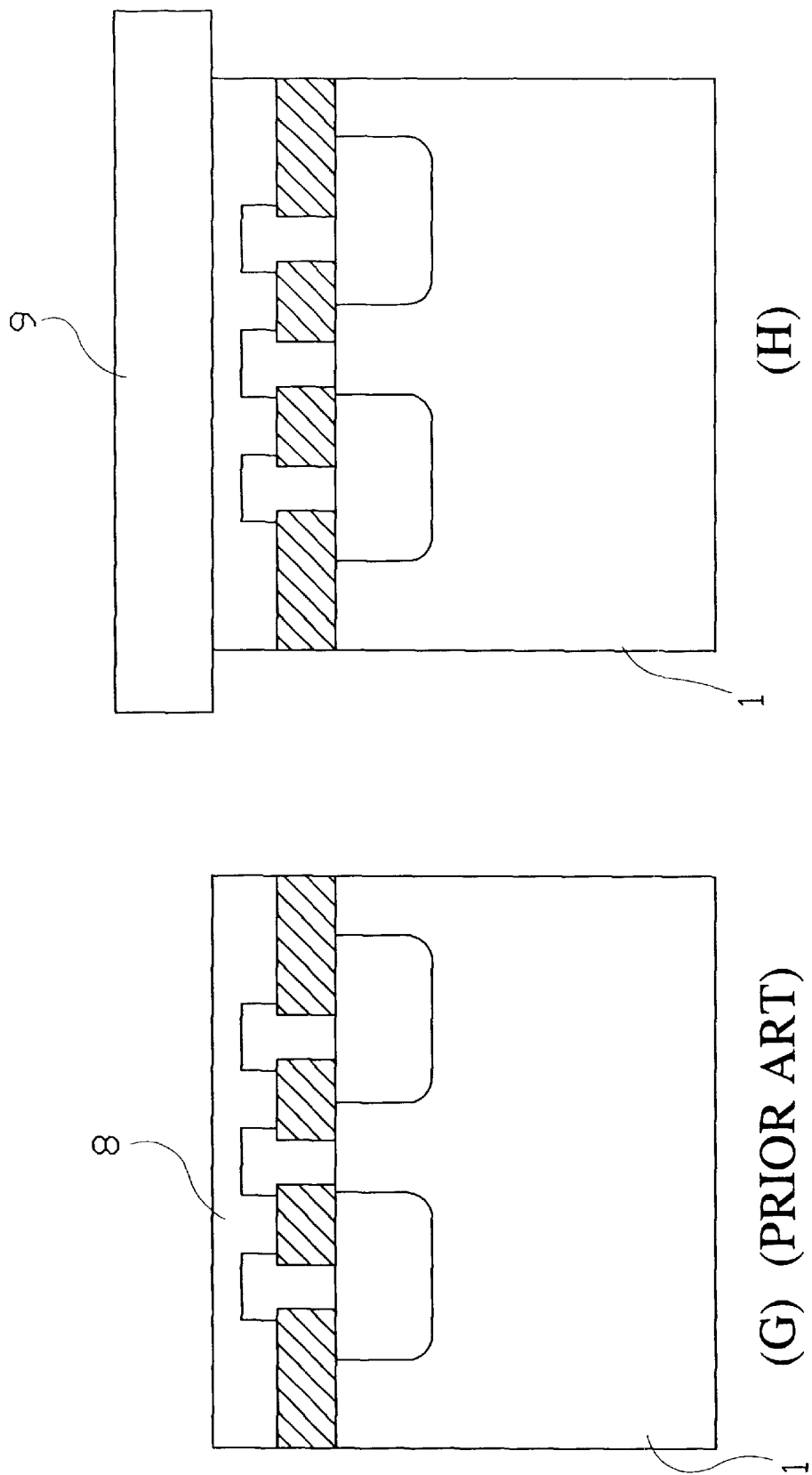
Figure 1:
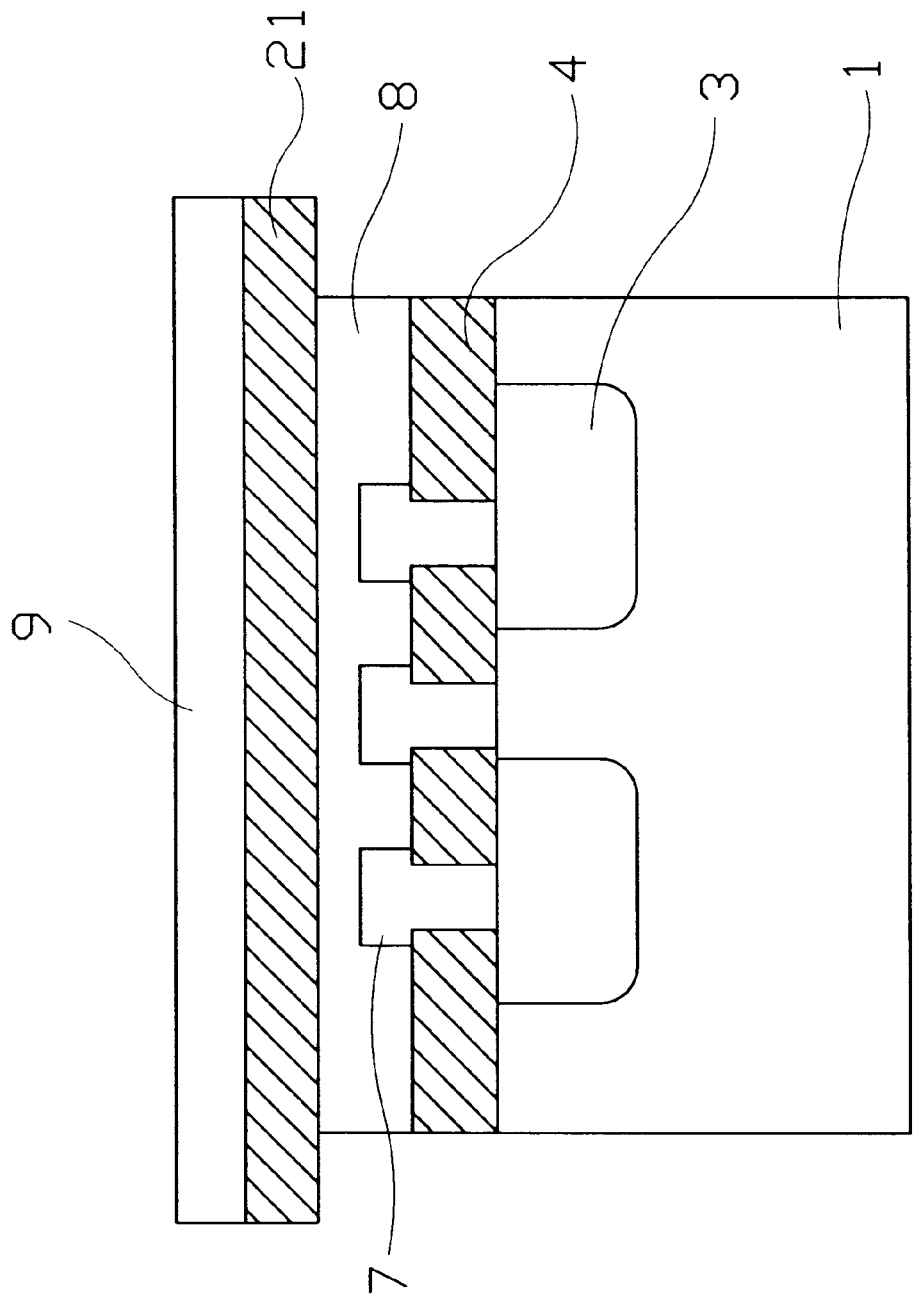
Figure 1:
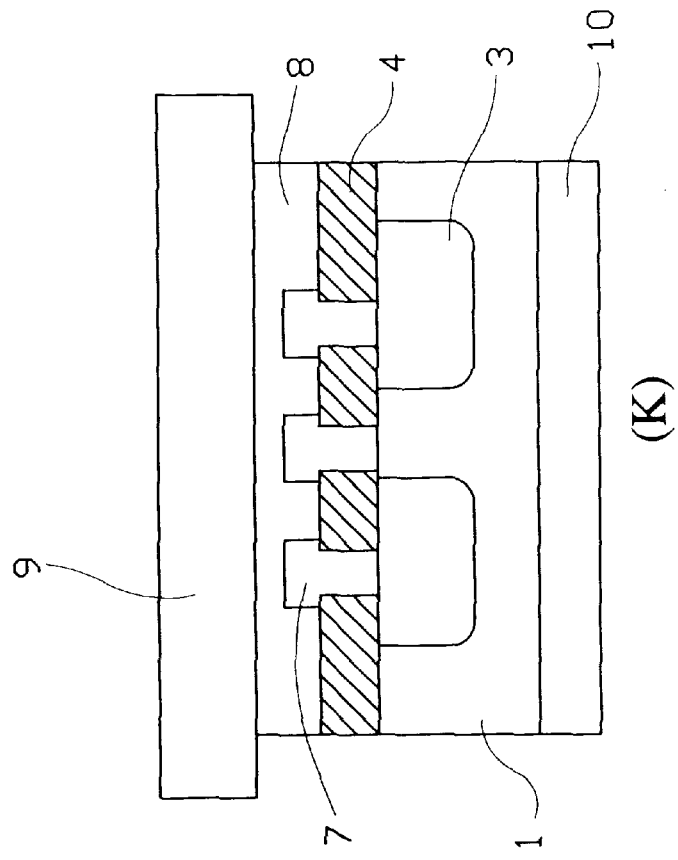
Figure 1:
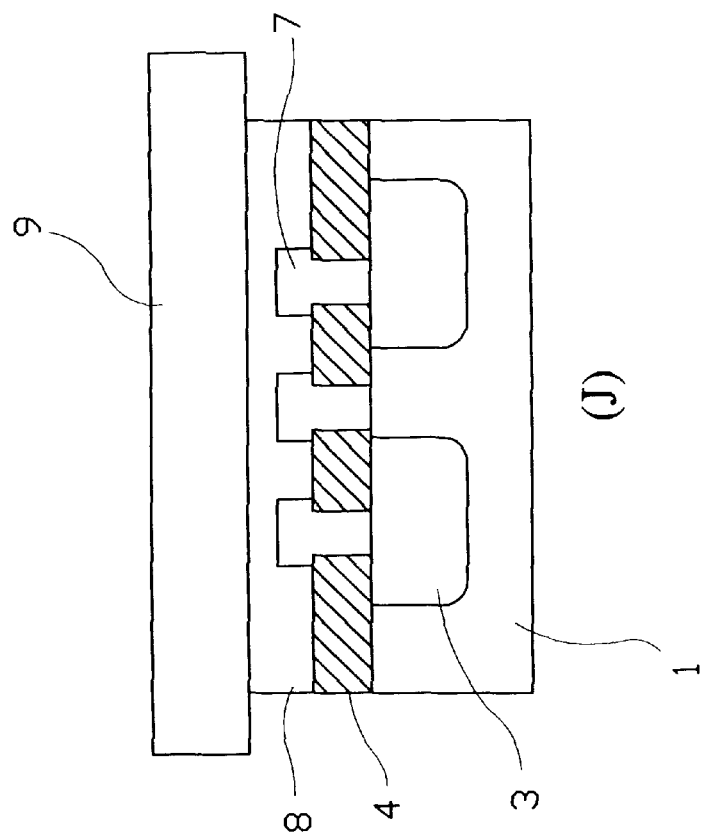
Figure 1:
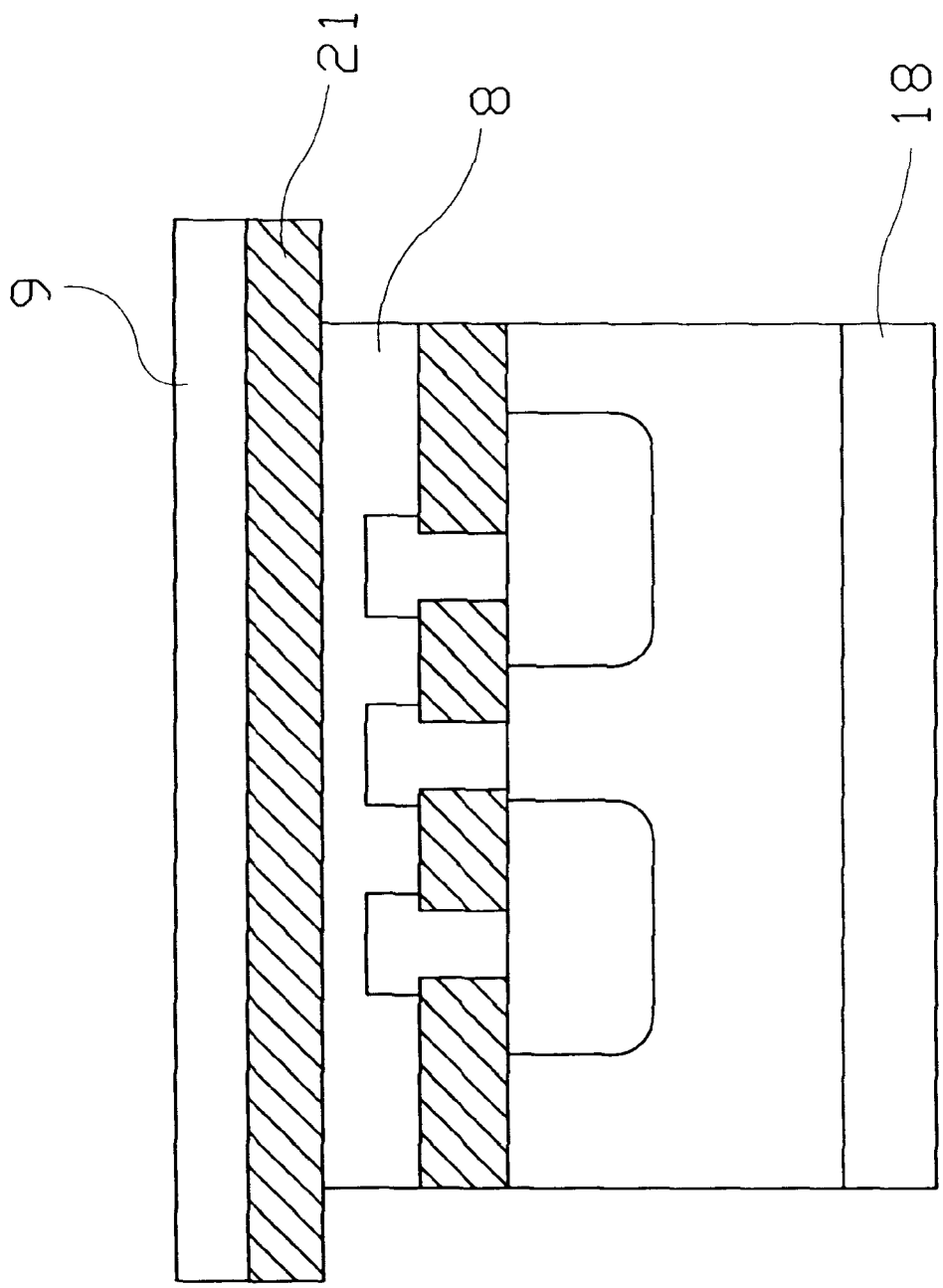
Figure 1:
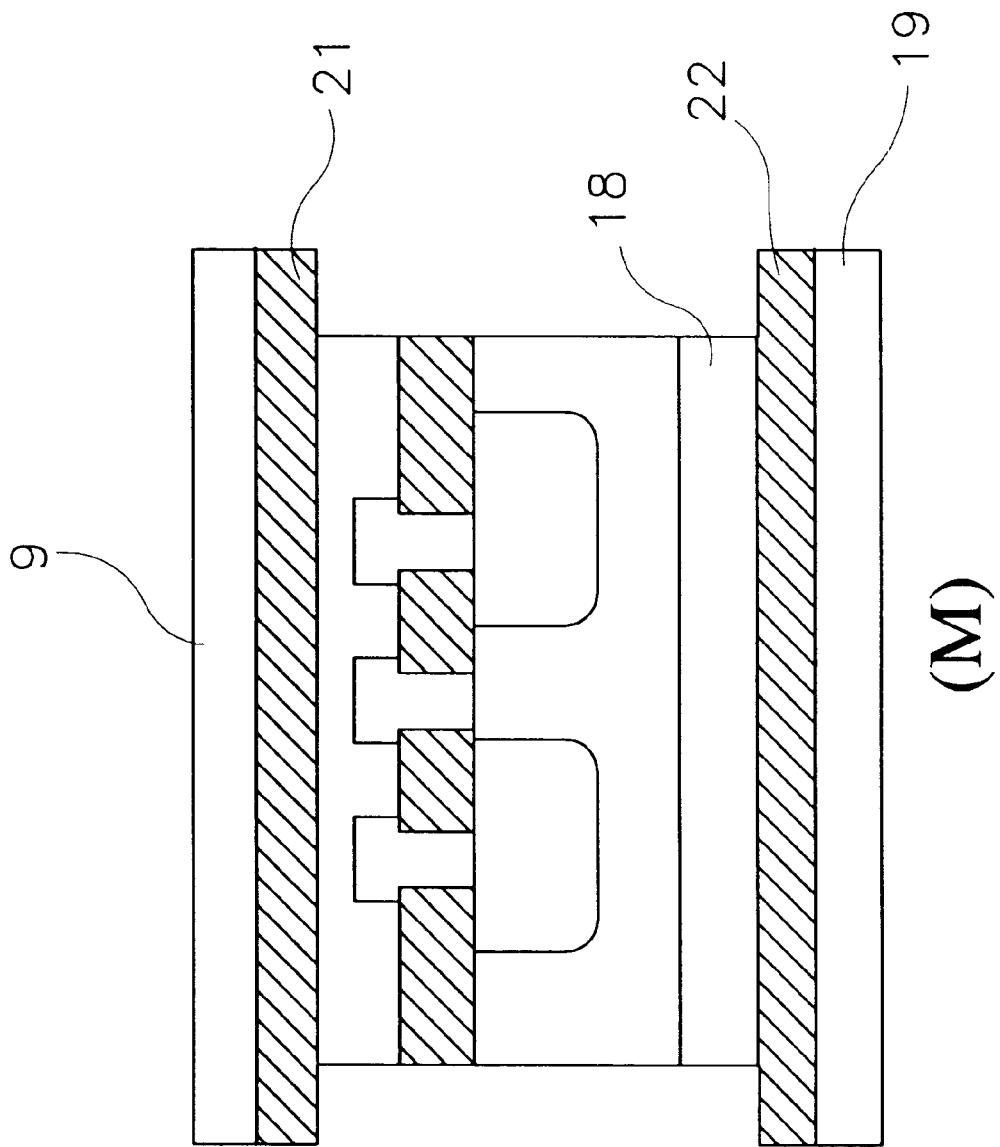
Figure 1:
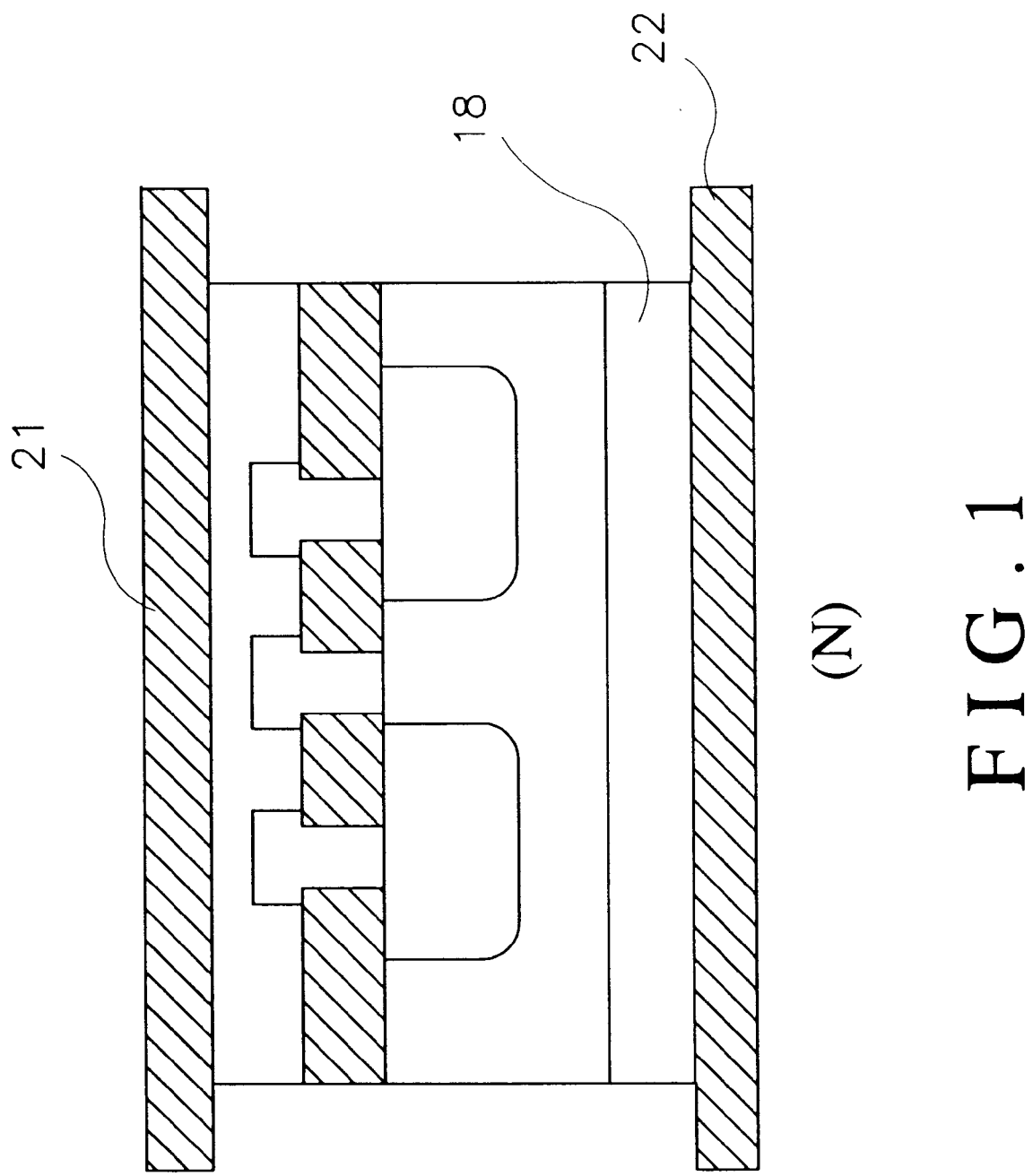

With reference to FIGS. 1A to 1N, a method for manufacturing a solar battery with thin film type of single crystal silicon in present invention comprises steps of:

(1) preparing a single crystal silicon substrate 1 of P type or N type with clean surface, spreading a layer of first photoresist 2 over said substrate 1, and etching appropriate regions of said photoresist 2 to be exposed to dope, as shown in FIG. 1A;

(2) doping dopant ions into said substrate through said appropriate regions of said photoresist to form active regions 3 to convert solar energy into electric energy, and removing said first photoresist 2; wherein said dopant ions are N type (e.g., $As^+$ ions) if said substrate 1 is P type, and said dopant ions are P type if said substrate 1 is N type (e.g., $BF_2^+$), as shown in FIG. 1B;

(3) forming a layer of oxide 4 (e.g., $SiO_2$) as shown in FIG. 1C;

(4) coating a layer of second photoresist 5 on said oxide 4 and exposing appropriate regions to form contact windows by exposure and development as shown in FIG. 1D;

(5) etching exposed regions of said oxide 4, removing said second photoresist 5, and covering a layer of metal 6 as shown in FIG. 1E;

(6) removing appropriate regions of said metal 6 with etching agent to form metallic lines 7 by coating a layer of third photoresist on said metal 6 and then exposing respective regions by exposure and development as shown in FIG. 1F;

(7) depositing a first anti-reflective layer 8 as shown in FIG. 1G;

(8) adhering a first transparent glass plate 9 to said first anti-reflective layer a after step (7) to support the substrate, as shown in FIG. 1H;

(9) grinding, etching, or electrically polishing the lower surface of the substrate 1 to reduce thickness as shown in FIG. 1J; and

(10) depositing a second anti-reflective layer 10 on bottom surface of said substrate 1 as shown in FIG. 1K.

The steps from (1) to (7) are similar to the prior arts. The steps from (8) to (10) show the advantages and features of the present invention to increase efficiency of energy transformation.

With reference to FIG. 1K, the solar battery of the present invention includes a first transparent glass plate 9 adhered to the upper surface of the substrate 1 with glue, and a second anti-reflective layer 10 which is deposited on the lower surface of the substrate 1. The thickness of the substrate 1 is about 1 to 80 micrometers. The first glass plate 9 is transparent for the incident light and supports the substrate 1 for grinding, etching, or electrically polishing. The second anti-reflective layer 10 is used to make the substrate 1 absorb more portion of the incident light.

In order to protect the first anti-reflective layer 8 against cracking, steps (8) to (10) are modified as followed.

With reference to FIG. 1I, a compound cover of the first glass plate 9 and a first transparent plastic plate 21 replaces the single first glass plate 9 in FIG. 1H. The bottom surface of the substrate 1 is ground to reduce the thickness, and then is covered with a second anti-reflective layer 18 as shown in FIG. 1L. Another compound cover, composed of the second glass plate 19 and a second transparent plastic plate 22 is adhered to the bottom surface of the substrate 1 as shown in FIG. 1M. Sequentially, the first and second glass plates are removed by heating or dipping into a solvent. The final structure of the solar battery is illustrated in FIG. 1N.

Figure 2:
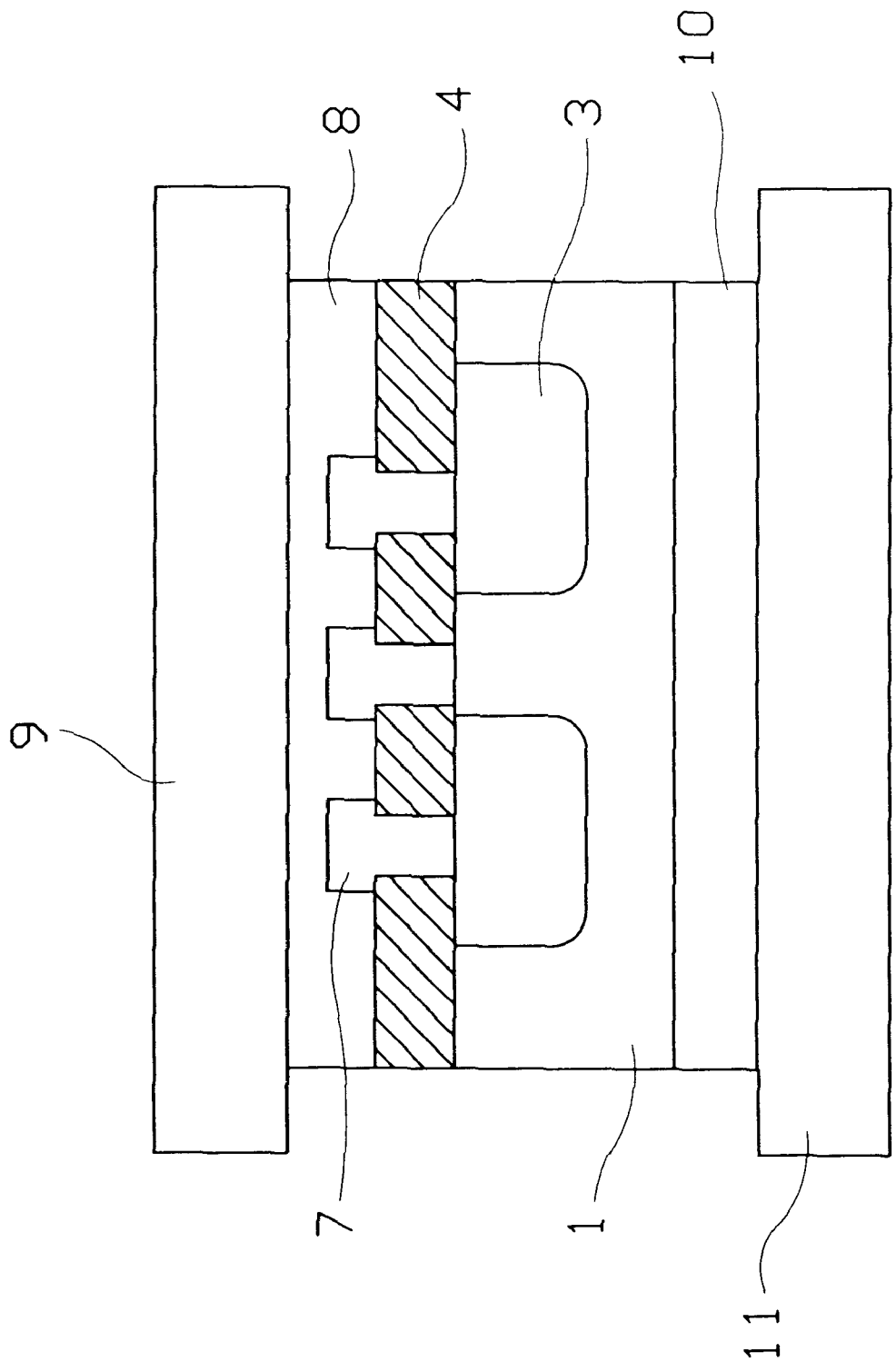
FIG. 2 illustrates a cross sectional view of the solar battery in accordance with a first embodiment of the present invention.

With reference to FIG. 2, a second glass plate 11 may be adhered to the second anti-reflective layer 10 after step (10) to protect the substrate 1 and prolong the life time of the solar battery.

Figure 3:
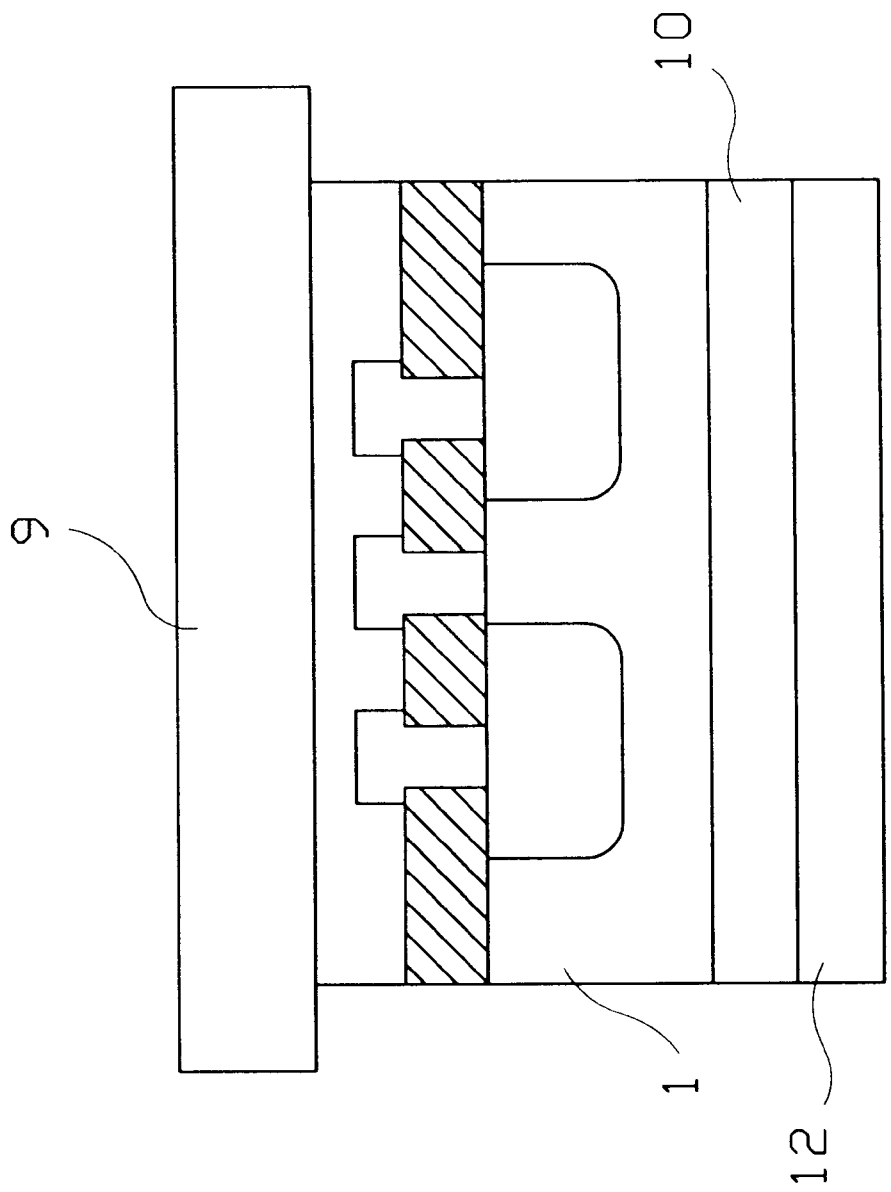
FIG. 3 illustrates a cross sectional view of the solar battery in accordance with a second embodiment of the present invention.

Additionally, after step (10), the second anti-reflective layer 10 may be covered with a layer of metal 12 by evaporation, sputtering, or deposition, as shown in FIG. 3, in order to further protect the substrate 1 and prolong the life time of the single-faced solar battery, which allows only the light incident on the upper face of the substrate 1 to be converted into electrical energy.

Figure 4:
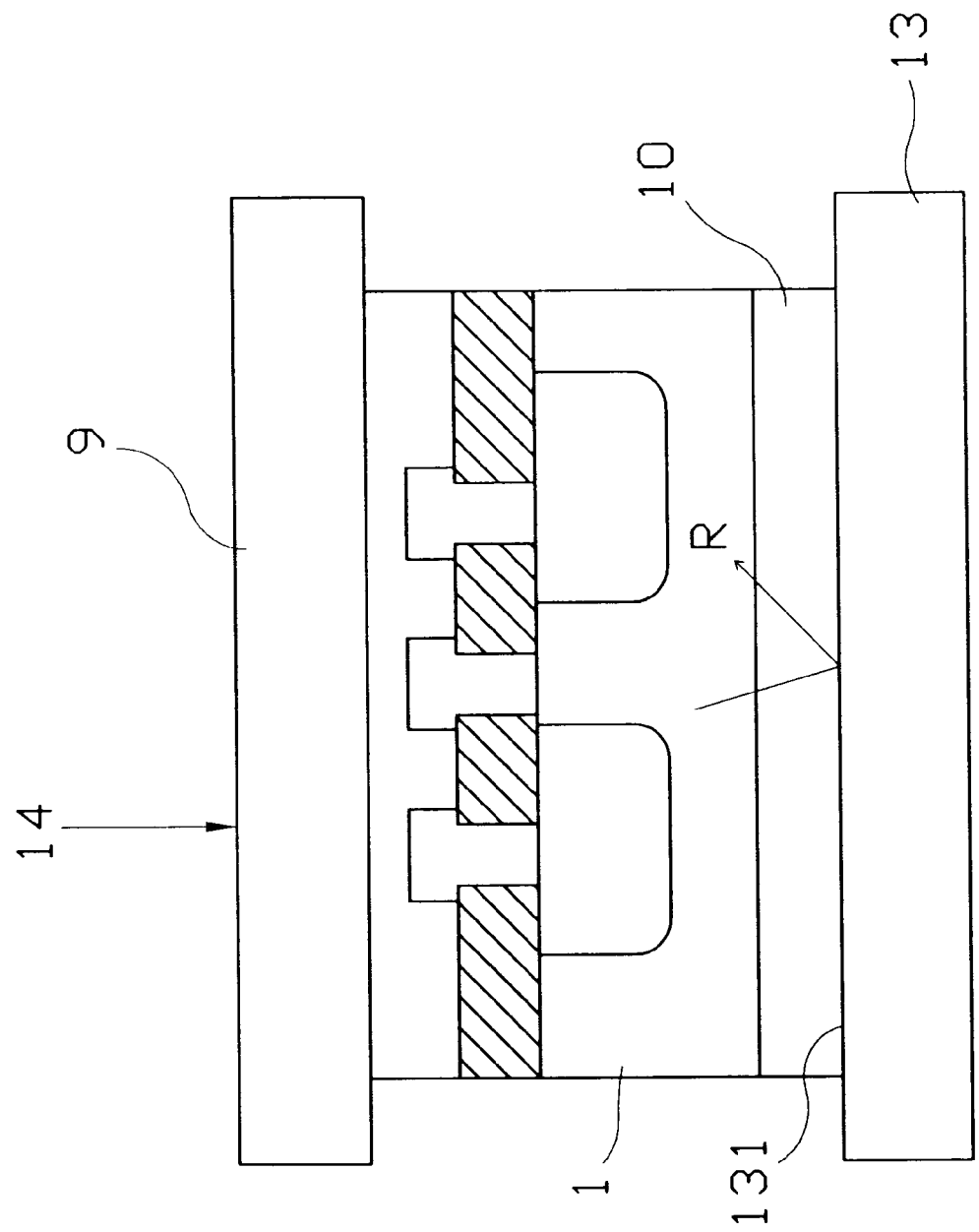
FIG. 4 illustrates a cross sectional view of the solar battery in accordance with a third embodiment of the present invention.

With reference to FIG. 4, in consideration of the single-faced solar battery, a reflective mirror 13 may be adhered to the bottom surface of the substrate 1 after step (10). The light is incident on the surface 131 of the reflective mirror 13 and partly reflected back along the line R such that the efficiency of energy transformation is increased due to more light absorbed by the active regions in the substrate 1.

Figure 5:
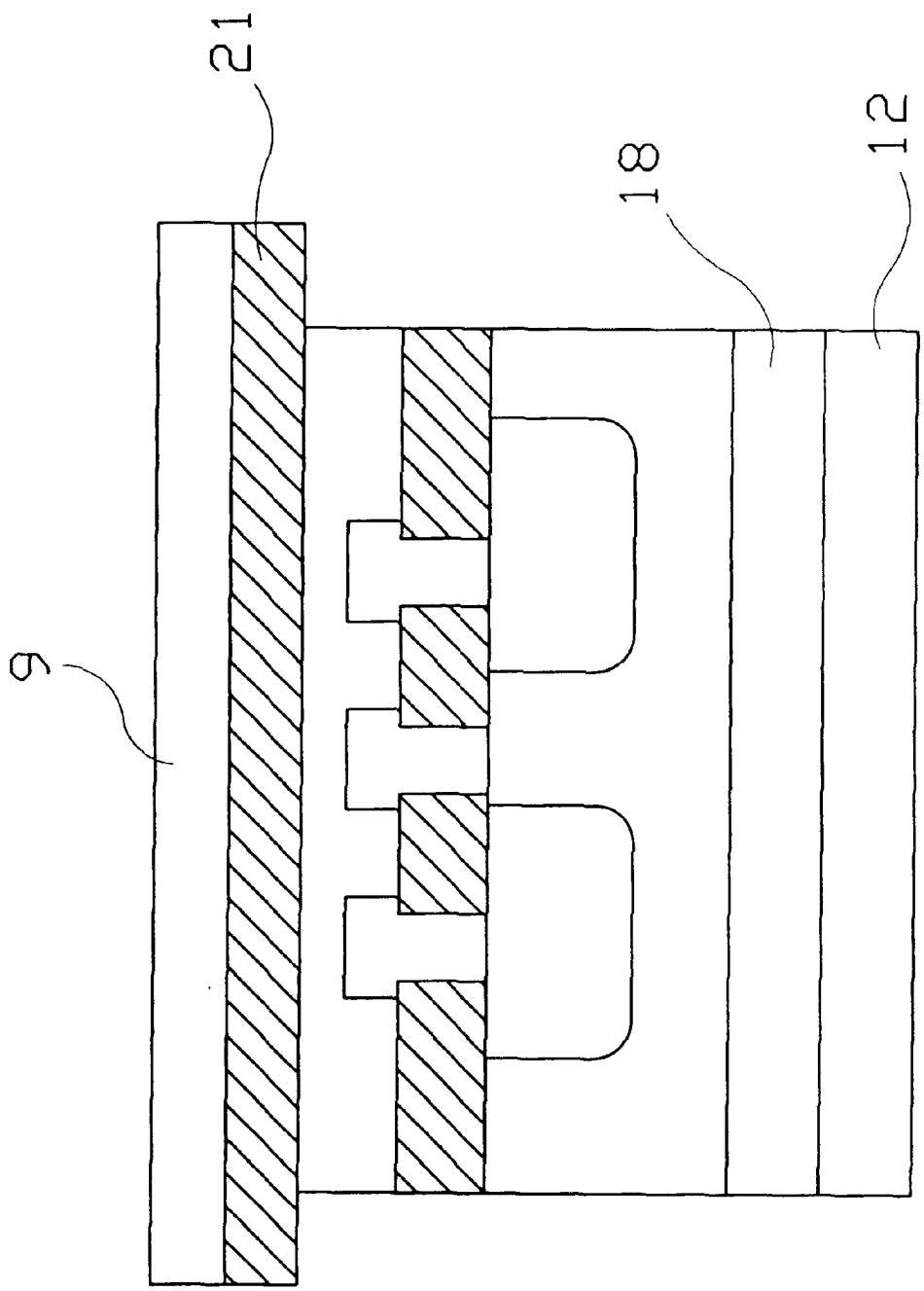
FIG. 5 illustrates a cross sectional view of the solar battery in accordance with a fourth embodiment of the present invention.
Figure 5:
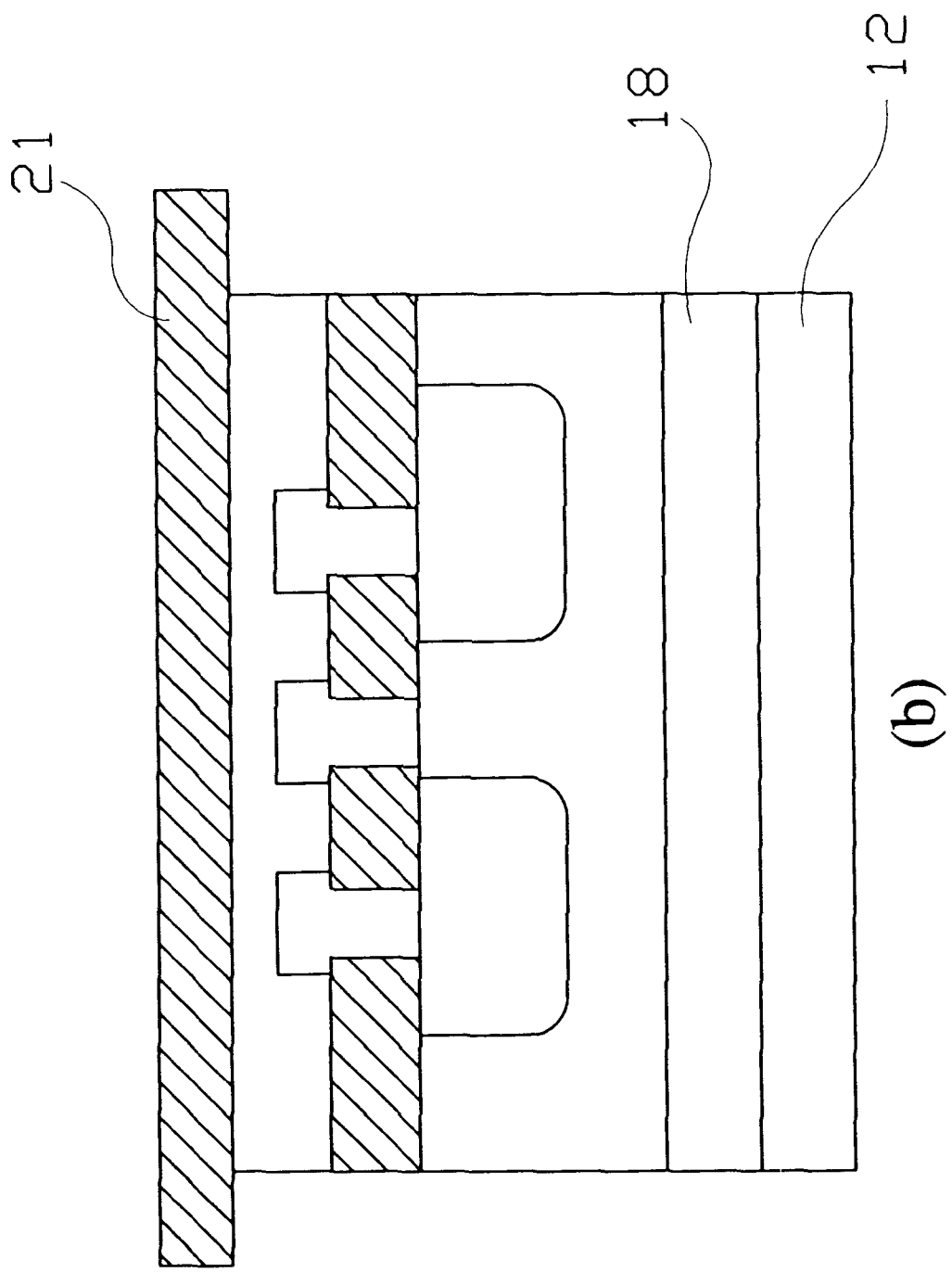

Another embodiment is illustrated in FIG. 5. The layer of metal 12 is deposited on the second anti-reflective layer 18 as shown in FIG. 5(a), and then the first glass plate 9 is removed by heating or dipping into a solvent as shown in FIG. 5(b).

In accordance with the present invention, the solar battery is implemented by a thin substrate of single crystal silicon, a glass plate adhered to the upper surface of the substrate, and an anti-reflective layer covering over the bottom surface of the substrate. Therefore, The chances for the incident light to be converted into electrical energy are increased such that the efficiency of energy transformation is also increased.

Although only the preferred embodiments of this invention were shown and described in the above description, it is requested that any modification or combination that comes within the spirit of this invention be protected.

What is claimed is:

1. A method for manufacturing a solar battery with thin film type of single crystal silicon, comprising the steps of:

(1) preparing a single crystal silicon substrate of P type or N type with clean surface, spreading a layer of first photoresist over said substrate, and etching appropriate regions of said first photoresist to be exposed to dope;

(2) doping dopant ions into said substrate through said appropriate regions of said first photoresist to form active regions, and removing said first photoresist; wherein said dopant ions are N type if said substrate is P type, and said dopant ions are P type if said substrate is N type;

(3) forming a layer of oxide;

(4) coating a layer of second photoresist on said oxide and exposing appropriate regions to form contact windows by exposure and development;

(5) etching exposed regions of said oxide and removing said second photoresist;

(6) covering a layer of metal;

(7) removing appropriate regions of said metal with etching agent to form metallic lines by coating a layer of third photoresist on said metal and then exposing respective regions by exposure and development;

(8) depositing a first anti-reflective layer on said metallic lines and said oxide layer;

(9) adhering a first transparent glass plate to a first transparent plastic plate;

(10) adhering said first transparent plastic plate to said first anti-reflective layer;

(11) grinding, etching, or electrically polishing the lower surface of said substrate to reduce thickness;

(12) depositing a second anti-reflective layer on the lower surface of said substrate;

(13) adhering a second transparent glass plate to a second transparent plastic plate;

(14) adhering said second transparent plastic plate to said second anti-reflective layer; and

(15) removing said first and second glass plates by heating or by dipping into a solvent.

2. A method as claimed in claim 1, wherein said substrate is about 1 to 80 micrometers in thickness.

3. A method as claimed in claim 1, wherein the bottom surface of said second anti-reflective layer is adhered to a reflective mirror.

4. A method as claimed in claim 1, wherein said second anti-reflective layer is covered with a layer of metal by depositing, evaporation, or sputtering to reflect incident light back into said active regions.

* * * * *